United States Patent [19]

Usui

[11] Patent Number: 5,966,518

[45] Date of Patent: Oct. 12, 1999

[54] CAPACITOR DESIGNING METHOD OF MOS TRANSISTOR

[75] Inventor: Sinichiro Usui, Kanagawa, Japan

[73] Assignee: NEC Corporation, Tokyo, Japan

[21] Appl. No.: 08/884,262

[22] Filed: Jun. 27, 1997

[30] Foreign Application Priority Data

Jun. 27, 1996 [JP] Japan ................................. 8-167387

[51] Int. Cl.⁶ .................. G06F 17/50; H01L 27/105; H01L 25/00
[52] U.S. Cl. .................. 395/500.02; 327/565; 257/296
[58] Field of Search .................. 364/488–491; 257/296, 300, 301, 306, 308; 327/565

[56] References Cited

U.S. PATENT DOCUMENTS

| | | | |
|---|---|---|---|
| 4,564,854 | 1/1986 | Ogura | 357/23.6 |
| 4,866,567 | 9/1989 | Crafts et al. | 361/311 |
| 5,006,739 | 4/1991 | Kimura et al. | 307/270 |
| 5,500,805 | 3/1996 | Lee et al. | 364/491 |

FOREIGN PATENT DOCUMENTS

| | | | |
|---|---|---|---|
| 0 171 445 | 2/1986 | European Pat. Off. | H01L 29/94 |
| 2-228063 | 9/1990 | Japan | H01L 27/04 |

OTHER PUBLICATIONS

Chern et al. ("A new method to determine MOSFET channel length", IEEE Electron Device Letters, vol. ESDL–1, No. 9, pp. 170–173, Sep. 1, 1980).

Wan et al. ("A new method to determine effective channel widths of MOS transistors for VLSI device design", Proceedings of the 1990 International Conference on Microelectronic Test Structures, pp. 217–220, Mar. 5, 1990).

De Almeida, A., et al., "Effects of Varying the Processing Parameters on the Interface–State Density and Retention Characteristics of an MNOS Capacitor," Solid–State Electronics, vol. 29, No. 6, pp. 619–624, Jun. 1986.

Miyake, M., et al., "Capacitance–Voltage Characteristics of Buried–Channel MOS Capacitors with a Structure of Sub-quarter–Micron pMOS," IEICE Trans. Electronics, vol. E79–C, No. 3, pp. 430–436, (Mar. 1996).

*Primary Examiner*—Kevin J. Teska
*Assistant Examiner*—Phallaka Kik
*Attorney, Agent, or Firm*—Foley & Lardner

[57] ABSTRACT

A method for designing to optimize a capacitor structure (channel length L, channel width W and number of division n) in a MOS transistor, in which the capacitor has a capacitance C and a gate-channel resistance R. A period from rising of a potential of a gate electrode to rising of potential of a diffusion layer is assumed as t2, a capacitance per unit area is assumed as K1 and a resistivity of the gate channel is assumed as K2 (S1), a period for propagating potential from a center portion of the gate channel to the end of a diffusion layer is assumed as t1 which is expressed by $t1=0.55$ CR (S2). Then, from $C=K1 \cdot LW$ (S2), and $R=K2 \cdot L/W$ (S3), $t1=0.55$ K1·K2 L² (S4). Assuming $t1=t2$, $L=\{t2/0.55K1 \cdot K2\}^{1/2}$ is calculated (S5, 6), and $W=C/K1 \cdot L$ is calculated (S7). From the capacitor region, a maximum value Wmax of the channel width is determined (S8) to derive number of division by rounding up the fraction below decimal point of quotient of W/Wmax.

4 Claims, 9 Drawing Sheets

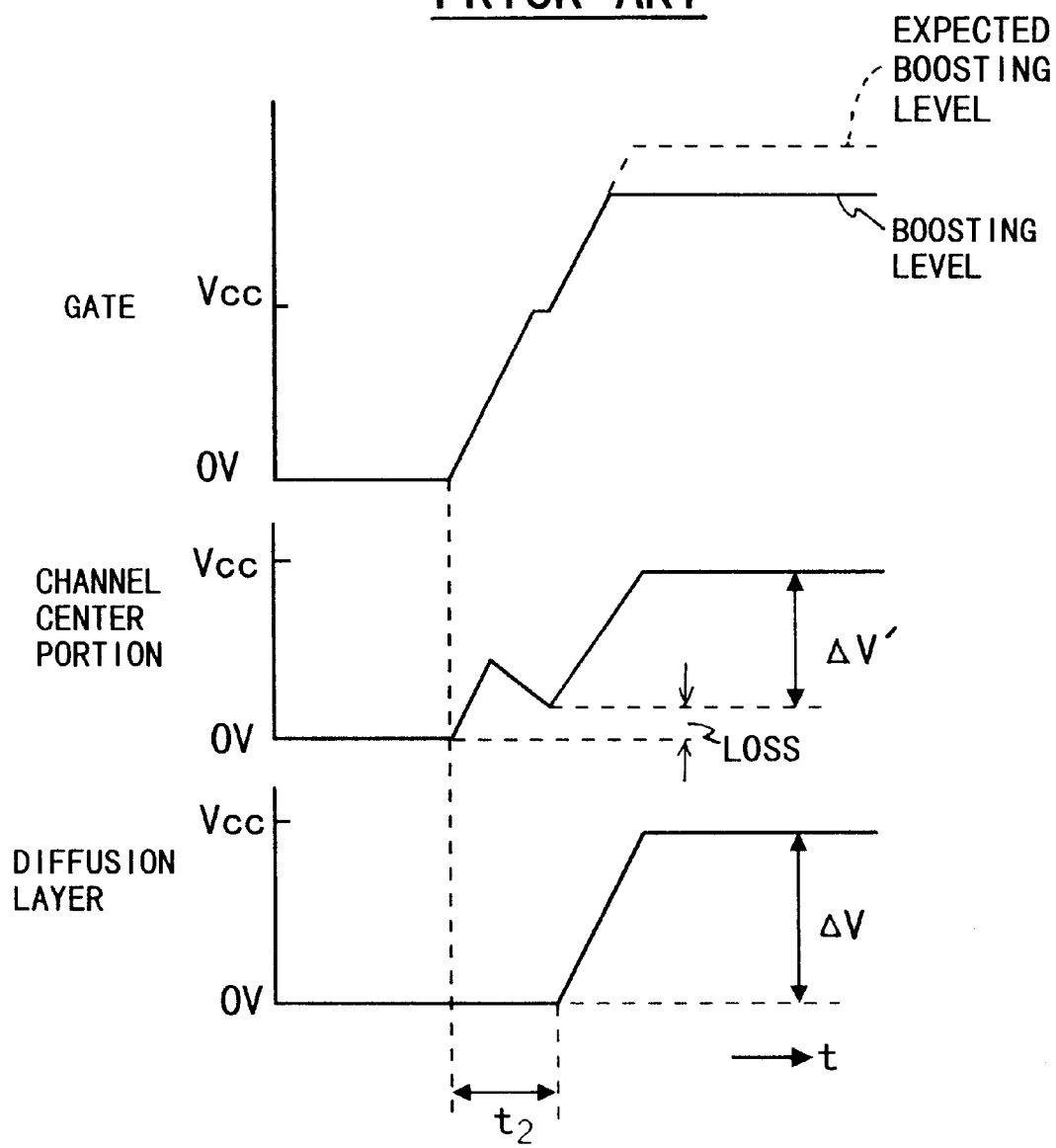

CAPACITOR DESIGNING METHOD OF MOS TRANSISTOR

BACKGROUND OF THE INVENTION

1. Field of the Invention

The present invention relates generally to a designing method of a capacitor of a capacitor formed with a MOS transistor. More specifically, the invention relates to a method for optimizing design of a capacitor structure.

2. Description of the Related Art

Upon designing a capacitor employing a MOS transistor, how to set a channel length, a channel width and number of division of a gate electrode is a problem. The problem will be discussed with taking one example of a structure of transistor. FIGS. 5 and 6 are plan view and sections taken along lines b–b' and c–c' of the conventional MOS transistors, in which a case where a channel length L is long, is shown in FIGS. 5, and a case where a channel length L is minimum is shown in FIG. 6.

As shown in FIG. 5, when a channel length L of a capacitor is long, a contact 1A is a contact of a diffusion layer 3A of source or drain of a transistor and a wiring 6A. On the other hand, a contact 1B is a contact of a diffusion layer 3B of source or drain of a transistor and a wiring 6A. These sources or drains are shorted by the wiring 6A via respective diffusion layers 3A and 3B nd contacts 1A and 1B of the wiring 6A. A contact 4A is a contact of a gate electrode 2A of the transistor and a wiring 5A. Channel portions 10 to 12 of a substrate represent center portion and end portions to be channel portions when a potential at the gate electrode 2A exceeds a threshold value of the transistor.

As shown in FIG. 6, when the channel length L of the capacitor is a minimum unit, the contact 1A is a contact of the diffusion layer 3A of the source or drain of the transistor and a wiring 6B. The contact 1B is a contact of the diffusion layer 3B of the source or drain of the transistor and the wiring 6A. Similarly, contacts 1C to 1J are contacts of diffusion layers 3C to 3J of sources and drains of the transistor and the wiring 6A. The sources or drains of the transistor are shorted by the wiring 6A via respective diffusion layers 3A to 3J and the contacts 1A to 1J of the wiring 6A. A contact 4B is a contact of gates 2A to 2H of the transistor and the wiring 5B.

FIG. 7 is an equivalent circuit diagram of the case where the capacitor of FIG. 5 is equally divided into n. A terminal 22 is a gate terminal which corresponds to the wiring 5A of FIG. 5, and a terminal 21 corresponds to the wiring 6A shorting the source and drain. Capacitors C1 to C3 are capacitors of first, second and third gates and channels when the channel is divided into n in the width direction (channel length is also divided into n). Capacitors Cn/2, Cn/2+1, Cn/2+2 are capacitors of (n/2)th, (n/2+1)th and (n/2+2)th gates and channels. Capacitors Cn−1, Cn, Cn+1 are capacitors of (n−1)th, (n)th and (n+1)th gates and channels. Capacitance of the capacitors C1 to Cn+1 become c/(n+1), respectively.

FIGS. 8A to 8C are charts respectively showing voltage levels in the case where the capacitor performs charge/discharge operation at high speed. FIGS. 8A to 8C are variation of internal potential as time goes. In the graphs of FIGS. 8A to 8C, vertical axis represents a potential at respective nodes and horizontal axis represents a distance from the end portion 10 of the diffusion layer on the section b–b' of FIG. 5.

Here, in FIG. 5 (FIG. 7), the initial value of the potential is assumed that the voltage of the gate 2A is the voltages of the diffusion layers 3A and 3B, and the voltages of the wiring 5A and 6A are respective 0V. Here, when the gate 2A (5A) of the transistor is pre-charged to a power source voltage VCC as shown in FIG. 8A, the center portion 11 of the channel of the transistor becomes floating until the gate voltage of the transistor exceeds the threshold value of the transistor. This makes the center portion 11 of the channel in floating in coupling of the gate and channel.

Next, as shown in FIG. 8B, the charge of the center portion 11 of the channel in floating condition is drawn into the grounding level via the gate channels 10 and 12 and the diffusion layers 3A and 3B after the gate voltage of the transistor exceeds the through value of the transistor. At this time, a period required to stabilize the potential at the grounding level becomes 2.2 times of a time contact of the channel from the center portion of the channel to the diffusion layer.

FIG. 9 is a timing chart in the case where charge/discharge operation of the capacitor as illustrated in FIG. 8 is performed at high speed. In a boosting circuit of the MOS transistor for high speed charge/discharge operation of the capacity, due to floating of the center portion 11 of the channel as shown in FIG. 8C, elevating of potential of the diffusion layers 3A and 3B as boosting operation is initiated before the potential becomes stable at the grounding level to reduce voltage variation ΔV of the channel as shown in FIG. 9 to be ΔV'. This makes it impossible to elevate the gate voltage to the desired level after boosting.

Stabilization of floating of the center portion 11 of the channel at the grounding level within a period from starting of pre-charging of the gate of the transistor to initiating elevation of the potential of the diffusion layer, can be achieved by setting the length L of the channel at the minimum unit. However, when the channel length L is set at the minimum unit, the channel width W becomes large correspondingly.

In general, when a capacitor of desired capacity is provided in a capacitor region, division of the capacitor region is performed. Then, number of the regions for the diffusion layers of the capacitor becomes one greater the number of division of the channel width. Therefore, according to increasing of the channel length, number of division of the gate is increased to increase number of the diffusion layer region to make the capacitor region excessively larger.

On the other hand, the desired gate voltage can be attained by setting the capacitance of the capacitor excessively large. However, this inherently cause unnecessary increase of the capacitor region. Furthermore, designing load for certainly providing the capacitor region can be increased. Accordingly, in the conventional designing method, setting of the channel length of the transistor or excessively increase the capacitance without taking the measure as set forth above. However, floating of potential at the center portion 11 of the capacity is inevitable.

As set forth above, the capacitor employing the transistor to be used in the conventional boosting circuit, is elevated the gate potential by elevating the potential of the diffusion layer of the source or the drain after charging the gate of the capacitor. However, after elevating the voltage of the diffusion layer, boosting level of the date can be lower than the boosting potential expected for the boosting circuit to degrade boosting efficiency.

This is because when the gate of the transistor is pre-charged to the power source voltage VCC, the center portion 11 of the channel is held in floating until the gate voltage exceeds the threshold value of the transistor. Since the center portion of the channel is held in floating by coupling of the gate and the channel, the center portion of the channel in the floating condition is drawn to the grounding level via the gate channel and the diffusion layer after the gate voltage exceeds the threshold value of the transistor. However, in the boosting circuit to perform charge/discharge portion of the capacitor at high speed, a period from starting pre-charging of the gate of the transistor to the power source voltage VCC to initiating elevating of potential of the diffusion layer of the source or drain is shorter than the period required to stabilize the center portion of the channel in floating condition at the grounding level. Therefore, as shown in FIG. 9, variation ΔV of the voltage at the channel can be reduced to make it impossible to transfer a sufficient amount of charge to the gate of the transistor. As a result, the gate voltage after boosting cannot reach the expected potential level to reduce voltage variation amount from ΔV to ΔV'.

On the other hand, in the boosting circuit performing charge/discharge operation of the capacitor at high speed, when the capacitor is constructed with a minimum unit of the channel length L, the capacitor region becomes unnecessarily large. Also, designing load therefor is also increased. This result from excessively short channel length in order to stabilize the potential at the center portion in floating state at the grounding level within the period from starting pre-charging of the gate of the transistor to initiation of elevation of the potential of the diffusion layer. This requires greater channel with so as to realize a desired capacity of the capacitor. The region in the width direction of the channel is limited. Therefore, the capacitor is formed by dividing the width of the channel so that the channel may be accommodated in the capacitor region. The diffusion region of the capacitor one greater number than the number of division of the channel width becomes necessary. Therefore, the capacitor region becomes large. Also, for low boosting efficiency, greater capacitance becomes necessary to make the capacitor region excessively large to increase designing load to certainly provide the capacitor region.

SUMMARY OF THE INVENTION

The present invention is worked out for solving the problems set forth above. It is an object of the present invention to provide a designing method of a MOS transistor, which can optimally design capacitor structure (channel length L, channel width W and number of division n).

According to the present invention, a method for designing capacitor of a MOS transistor, in which a drain region and a source region at both side of a gate channel region on a diffusion layer are shorted, and a capacitor having a capacitance C, a channel length L and a channel width W is formed by a portion where a gate electrode and said gate channel region overlap, with taking a capacitance of the overlapping portion of said gate electrode and said gate channel region per unit area being K1 and a resistively of said gate channel region being K2, for application to a circuit, in which charge and discharge of said capacitor is performed at high speed, comprises a step of setting said channel length L and said channel width W of said MOS transistor in such a manner that a period t1 for propagating a potential from a center portion of said gate channel to said drain region or said source region, and a period t2 from rising of potential of said gate electrode from a grounding potential to a power source potential to elevating of a potential in said diffusion layer region opposing to said gate electrode from the grounding potential to the power source potential are substantially equal to each other.

In the present invention, when said channel length or said channel width are set, said channel width W or said channel length L may be derived from $$W = C/K1 \cdot L \text{ or } L = C/K1 \cdot W$$

Also, in the present invention, the method for designing capacitor of a MOS transistor may further comprise:

a step of calculating said channel length L from:

$$L = \{t2 / (0.55 \cdot K1 \cdot K2)\}^{1/2}$$

assuming that a resistance of said gate channel of said MOS transistor being R, by deriving a relationship expressed by $$t1 = 0.55 \ K1 \cdot K2 \cdot L^2$$

from relationship expressed by $$t1 = 0.55 CR$$

$$C = K1 \cdot LW$$

$$R = K2 \cdot L/W;$$

S step of deriving the channel width W from said channel L derived in the former step through $$W = C/K1 \cdot L;$$

a step of deriving a maximum value Wmax of said channel width W from a capacitor region; and a step of setting number DIV of division of said capacitor by rounding up a fraction below decimal point of quotient of W/Wmax.

In the present invention, a boosting circuit, in which charge/discharge operation of the capacitor is performed at high speed, it is inherent that the center portion of the gate channel is situated in the floating condition. The problem of the floating condition of the center portion of the gate channel may not be a problem when the potential at the center portion of the gate channel is stabilized at the grounding level until rising of potential of the diffusion layer for boosting operation. The period to stabilize the center portion of the gate channel in the floating condition at the grounding level is the period t1 to propagate the potential at the center portion to the diffusion layer. The period t1 to propagate the potential at the center portion of the gate channel to the diffusion layer is determined by the channel length L. Thus, influence of the floating condition of the center portion of the gate channel can be successfully avoided by determining the channel length to adjust the period t2 from initiation of pre-charging of the gate to initiation of rising of potential of the diffusion layer for boosting operation, to be consistent with the period t1 required to stabilize the potential at the center portion of the gate channel at the grounding level.

With the construction set forth above according to the present invention, the channel length is determined so that the potential at the center portion of the gate channel can be stabilized at the grounding potential within a period from initiation of charting of the gate of he transistor forming the capacitor to initiation of elevation of potential of the diffusion layer of the source or drain. Thus, decreasing of the voltage variation amount at the channel can be avoided to permit feeding of sufficient amount of charge to the gate to make the boosting level of the gate voltage sufficient. Also, on the basis of the determined channel length, the channel width is determined to achieve desired capacitance. Since the channel width has an upper limit in view of mask design.

By dividing the gate so as to satisfy the mask designing standard, the number of divided gate becomes minimum. Also, the number of the diffusion layers which should be one greater number than that of the number of divided gate, becomes minimum. Therefore, the required capacitor region can be minimum.

BRIEF DESCRIPTION OF THE DRAWINGS

The present invention will be understood more fully from the detailed description given hereinafter and from the accompanying drawings of the preferred embodiment of the present invention, which, however, should not be taken to be limitative to be present invention, but are for explanation and understanding only.

In the drawings:

FIG. 9 is a chart showing operation of respective portion of the semiconductor device having excessively long channel length of FIG. 6.

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid unnecessary obscure the present invention.

Figure 1:
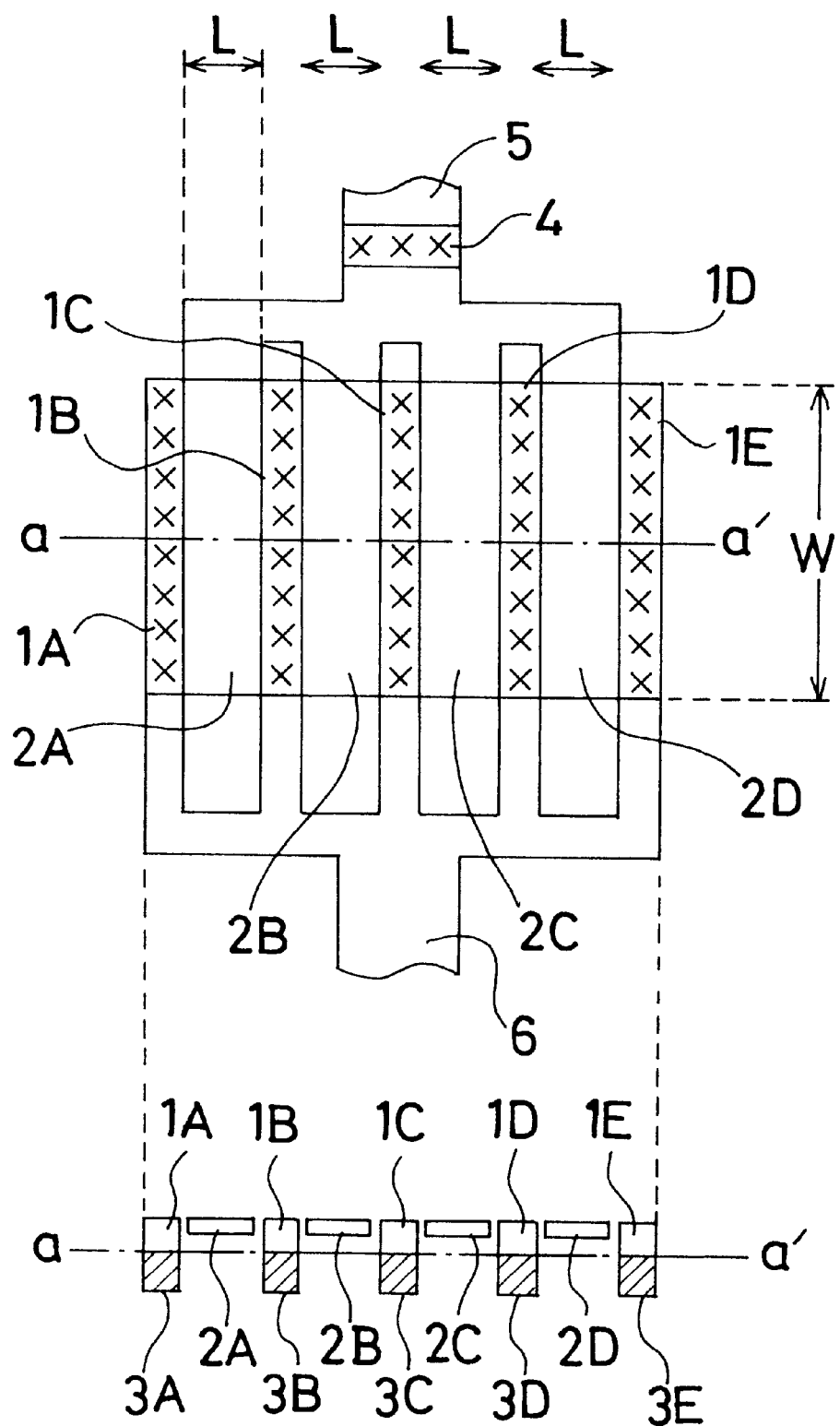
FIG. 1 is an illustration showing a plan view and a section of one embodiment of a semiconductor device according to the present invention.
Figure 2:
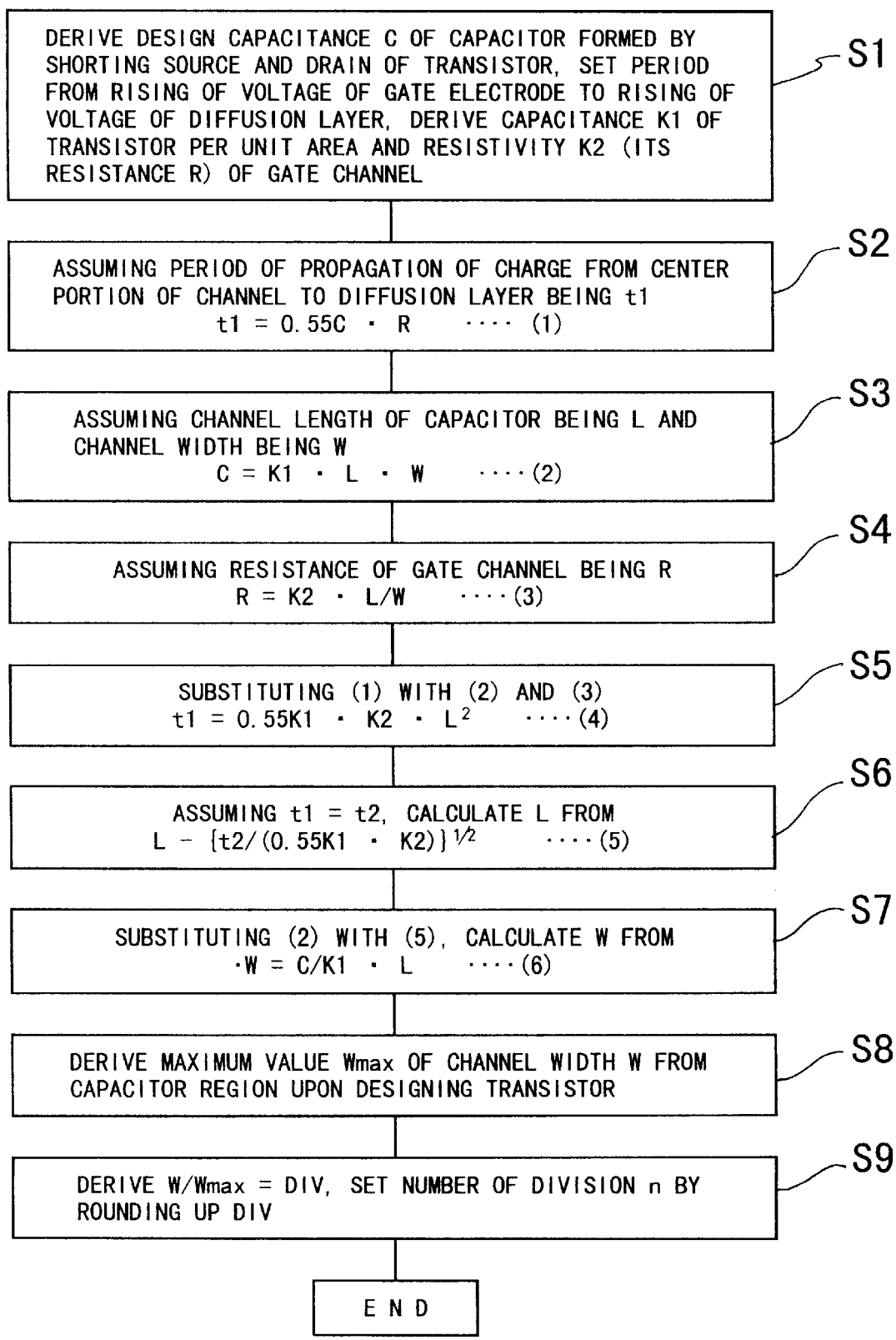
FIG. 2 is a flowchart for explaining one embodiment of the designing method according to the present invention.

FIG. 1 is an illustration showing a plan view and a section of one embodiment of a semiconductor device designed by the present invention, and FIG. 2 is a flowchart for explaining one embodiment of the designing method according to the present invention. A capacitor, shown in FIG. 1, has contacts 1A to 1E are contacts of diffusion layers of sources and drains of transistor and wiring. The sources or drains are shorted by the wiring 6 via respective diffusion layers 3A to 3E and contacts 1A to 1E of the wiring. A contact 4 is a contact of gates 2A to 2D of the transistor and a wiring 5.

Figure 3A:
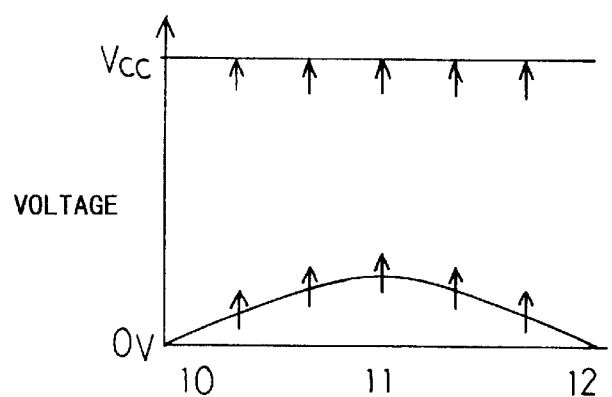
FIGS. 3A to 3C are charts showing voltage of respective portion for explaining operation of the semiconductor device of FIG. 1.
Figure 3B:
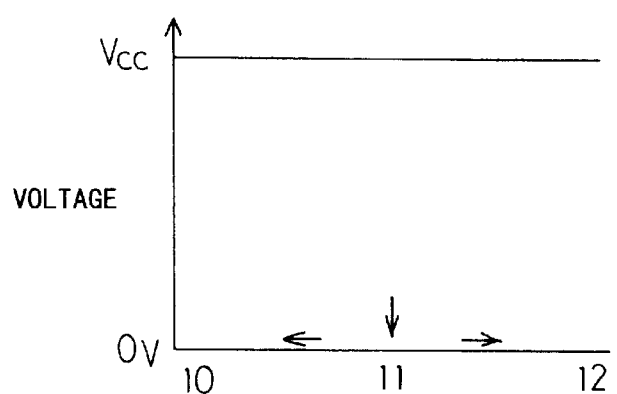
Figure 3C:
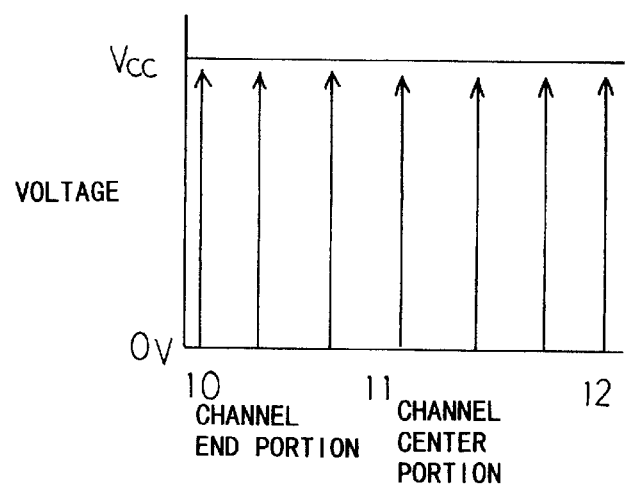
Figure 4:
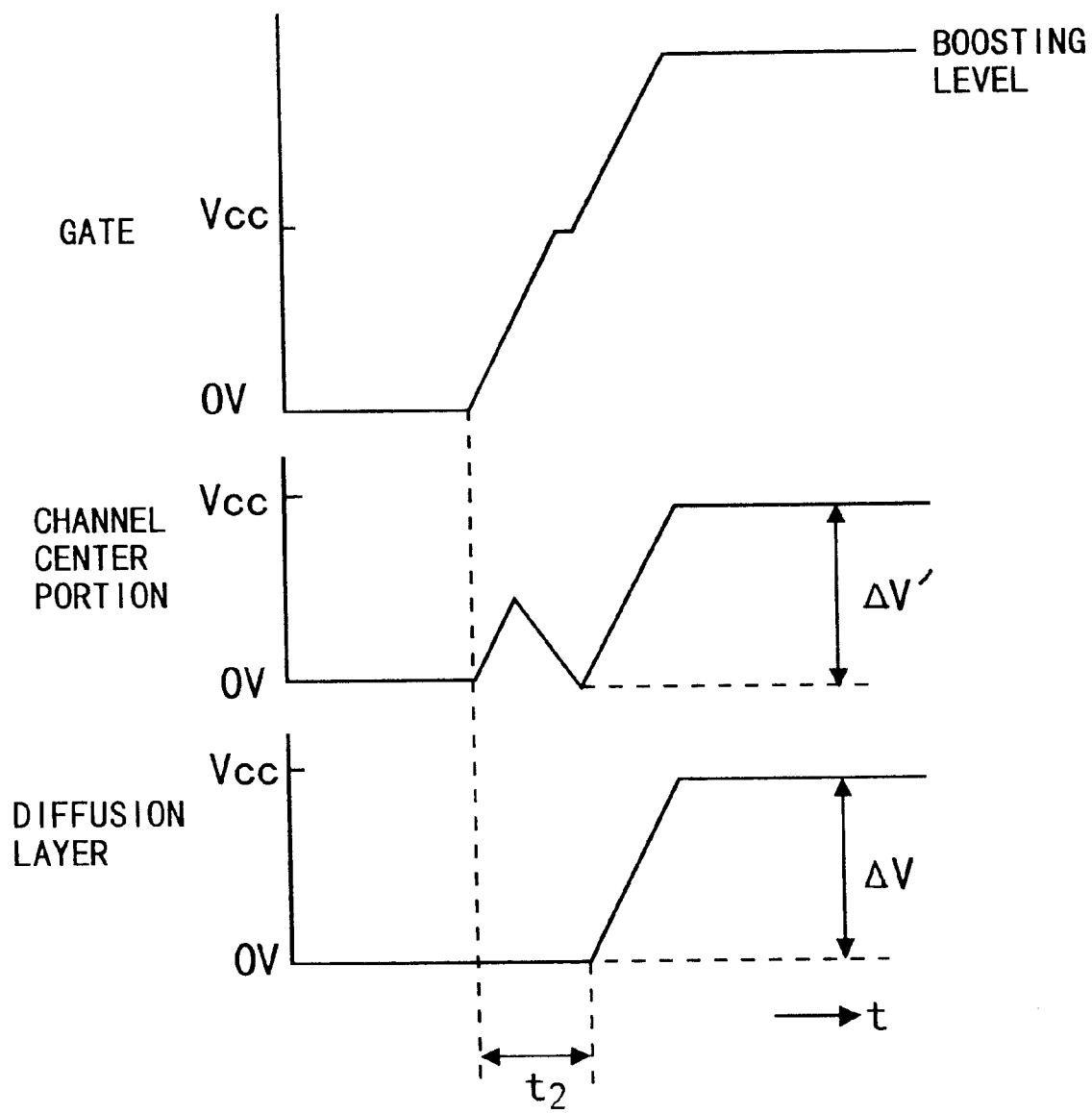
FIG. 4 is a chart showing operation of respective portion of the semiconductor device of FIG. 1.
Figure 5:
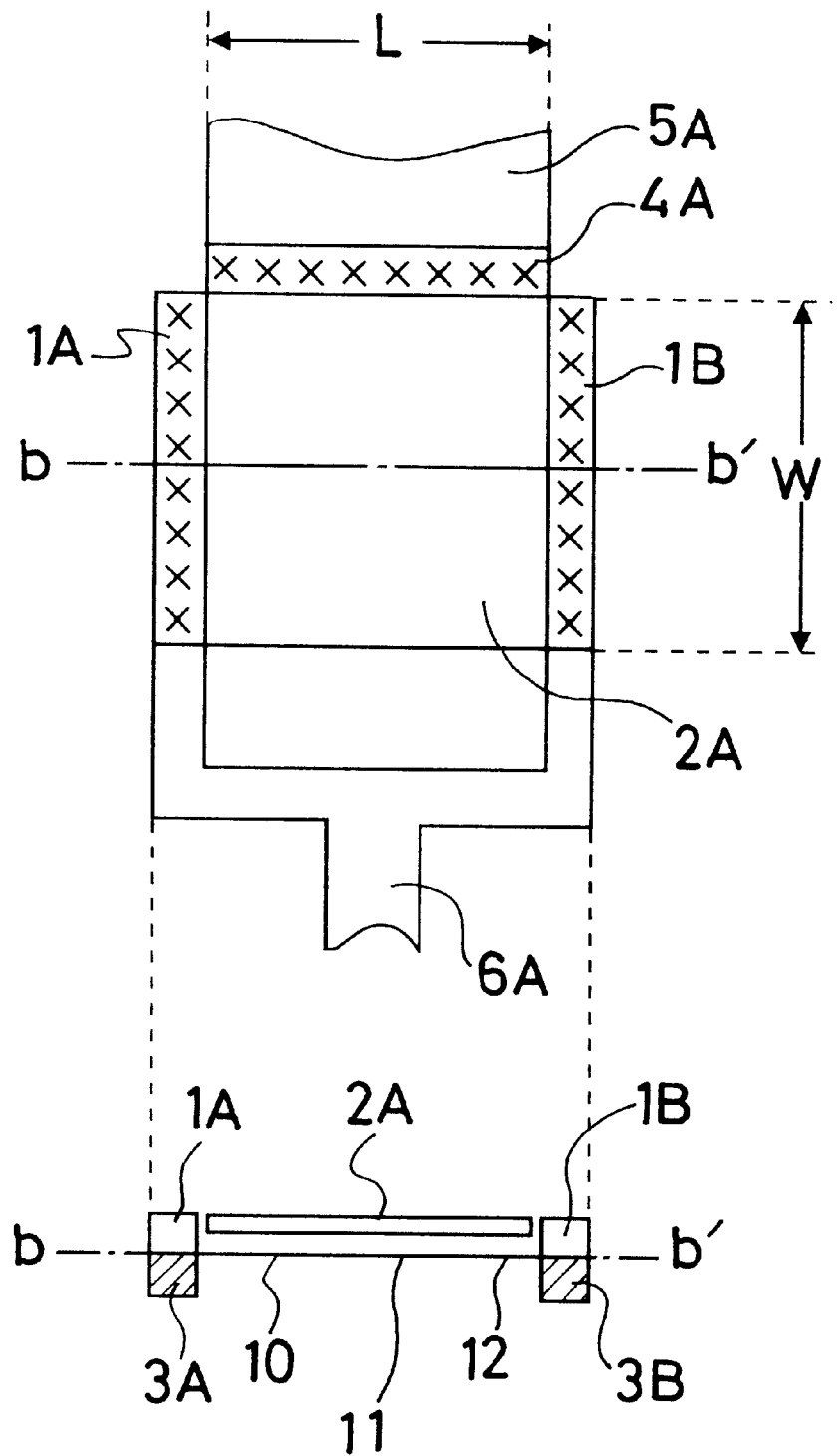
FIG. 5 is an illustration showing a plan view and a section of the conventional semiconductor device having excessively long channel length.
Figure 6:
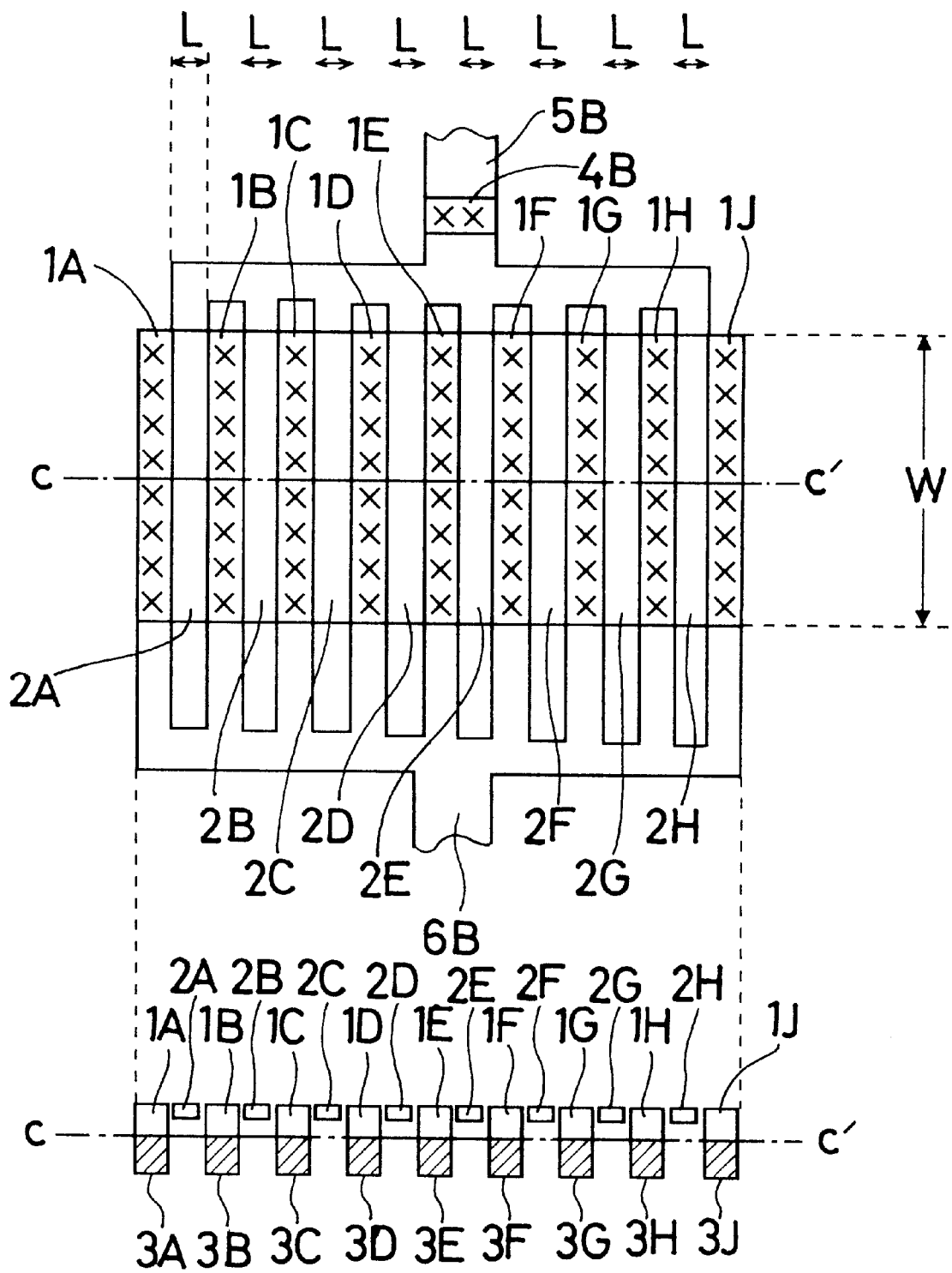
FIG. 6 is an illustration showing a plan view and a section of the conventional semiconductor device having excessively short channel length.
Figure 7:
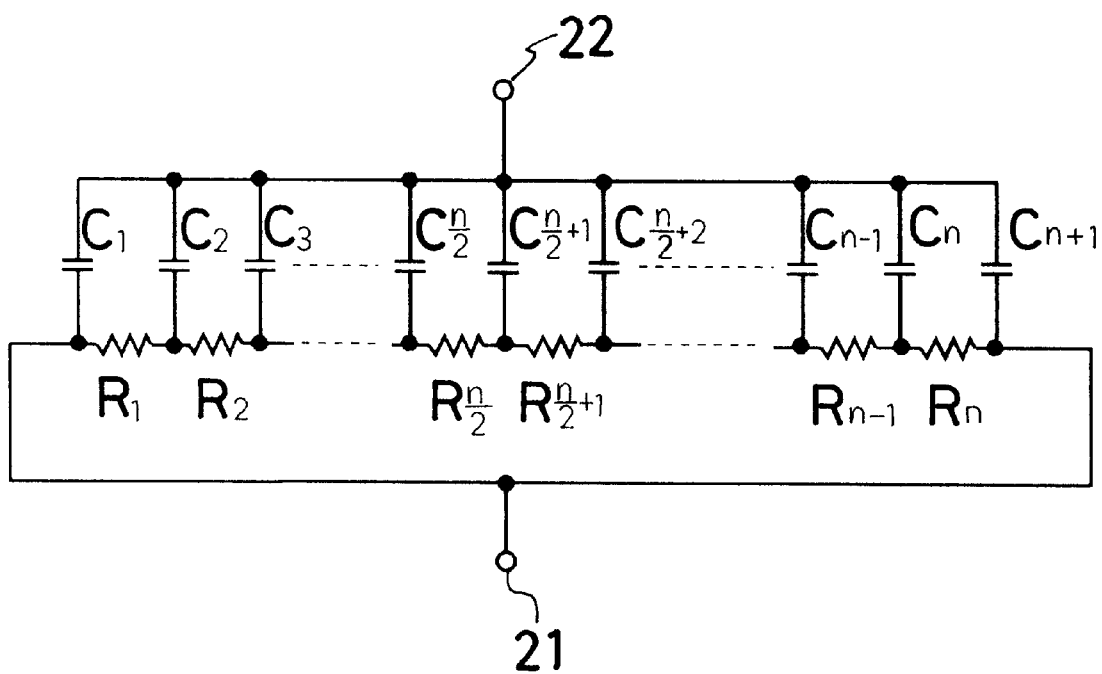
FIG. 7 is an equivalent circuit diagram of FIG. 5.
Figure 8A:
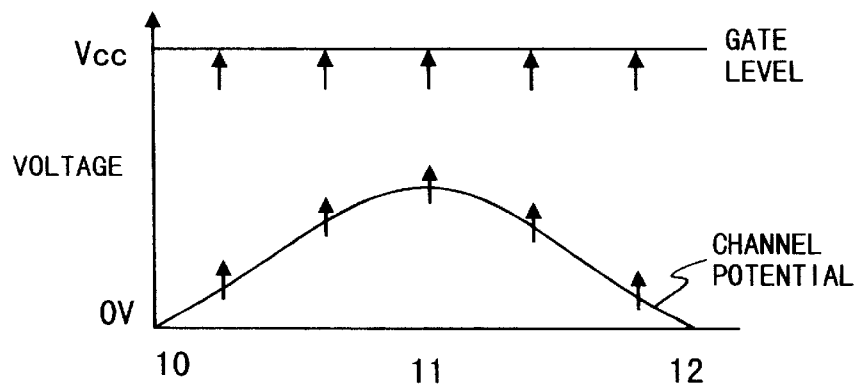
FIGS. 8A to 8C are chart showing voltage of respective portion for explaining operation of the semiconductor device of FIG. 5.
Figure 8B:
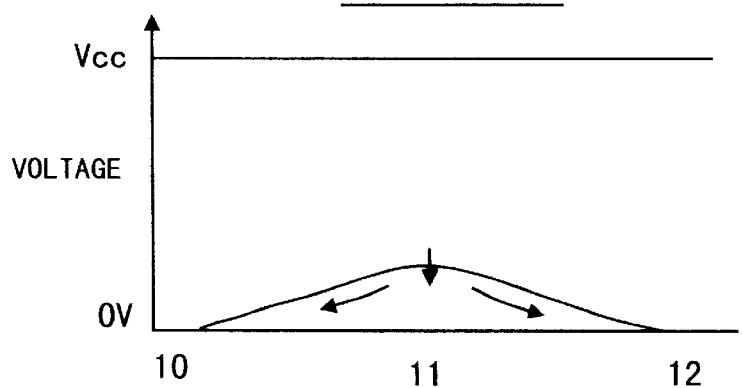
Figure 8C:
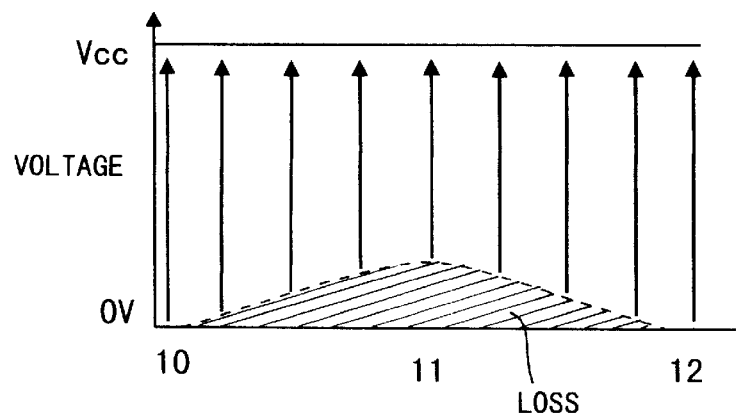

The circuit of the transistor is equal to the equivalent circuit of FIG. 7 of the capacitor equally divided into n. Even in this case, when the channel length is excessively long, high speed boosting operation is similar to FIGS. 8A to 8C and 9. High speed boosting operation of the capacitor designed by the preferred embodiment of optimal designing method will be explained with reference to FIGS. 3A to 3C showing voltage of respective portion for explaining operation of the semiconductor device of FIG. 1 and FIG. 4 showing operation of respective portion of the semiconductor device of FIG. 1.

When the capacitor having the structure of FIG. 1 is designed, designing process is performed as illustrated in FIG. 2. Namely, at step S1, on the basis of parasitic capacitance at nodes of boosting circuit or so forth to be application of the capacitor and desired boosting level, a target capacitance C is set. Also, a booting period t2, namely a period from booting of the potential at the gate electrode of the capacitor from the grounding potential to the power source voltage level, to elevating the potential in the diffusion layer of the source or the drain region from the grounding potential to the power source voltage level, is set. On the other hand, on the basis of a designing standard of the material to form the semiconductor device, a capacitance K1 per unit area of the capacitor and electrical resistivity K2 of a gate channel are derived.

In general, in transition in an RC circuit, rising and falling period T of the signal is expressed as:

$$T = 2.2\, RC \tag{1}$$

Here, it is assumed that a period from starting pre-charge for the gate of the transistor to stabilize the center portion of the channel of the transistor in floating condition at the grounding level, is t1, a necessary capacitance of the capacitor generated in the transistor of the boosting circuit or so forth is C, and a channel resistance from the source to the drain of the transistor is R. From the equation (1) and the equivalent circuit of FIG. 7, in which the transistor is divided into n in the gate direction, approximately expression:

$$t1 = 2.2 \times (n/2) \times (R/n) \times \{(n+1)/2\} \times C/(n+1)$$

$$t1 = 2.2 \cdot C \cdot R \tag{2}$$

is derived (this step correspond to step S2)

Here, assuming that the channel width is W, the channel length is L, the capacitance per unit area between the gate and channel is K1, the capacitance C of the capacitor is derived from the following equation (step S3)

$$C = K1 \cdot L \cdot W \tag{3}$$

On the other hand, assuming that the electrical resistivity of the transistor is K2, a resistance R of the channel is derived from the following equation (step S4).

$$R = K2 \cdot L / W \tag{4}$$

By substituting the equation (2) with the equations (3) and (4), the following equation (5) is obtained (step S5). By converting this into the equation of L, the following equation (6) is obtained.

$$t1 = 1.1 \cdot K1 \cdot K2 \cdot L^2 \cdot W / (2W) \tag{5}$$
$$= 0.55\, K1 \cdot K2 \cdot L^2$$

$$L = \{t1/(0.55 \cdot K1 K2)\}^{1/2} \tag{6}$$

Next, by making the period t1 from starting of precharging for the gate of the transistor to stabilization of the center portion of the channel in the floating condition at the grounding level and the period t2 from starting of pre-charging for the gate of the transistor to starting of the boosting operation of the diffusion layer of the source or drain, equal to each other, boosting operation of the diffusion layer of the source or drain is started after stabilization of the center portion of the channel at the grounding level. Accordingly, $$L=\{t2/(0.55 \cdot K1 \cdot K2)\}^{1/2} \quad (7)$$

Can be obtained (step S6). The channel length L thus obtained is the optimal value. From this L, the channel width W of the capacitor is obtained from the equation (8) converted from the equation (3) (step S7).

$$W=C/K1 \cdot L \quad (8)$$

Here, the maximum value Wmax of the channel width W is determined based on a design standard or given capacitor region (step S8). In order to place the capacitor within the capacitor region, the channel width of the capacitor has to be divided. Number of division of the capacitor for this purpose is derived as a value DIV in the following equation.

$$DIV=W/W\text{max} \quad (9)$$

As actual number of division of the capacitor, the value rounding up the fractions below decimal point of DIV may be used.

It should be noted that, since the foregoing equation (8) can be expressed as L=C/K1·W, it is clear that either of L or W is to be derived at first.

The particular embodiment of the present invention will be discussed hereinafter. For example, a required capacitance C of the capacitor of the boosting circuit or the like, a period t2 from initiation of pre-charging of the gate of the transistor to initiation of boosting operation for the diffusion layer of the source or the drain, a capacitance K1 between the gate and channel per unit area and an electrical resistivity K2 of the channel of the transistor are assumed to be set as follows.

$$C=3 \ pF, \ t2=2 \ ns, \ K1=190\times10^{-5} \ pF/\mu m^2, \ K2=20$$

KΩ/divided channel,
from (3), $$C=190\times10^{-5}\times L\times W$$

and from (4)

$$R=20000\times L/W$$

Are established. By substituting the foregoing equation (2) with these, $$t1 = 0.55\times 190\times 10^{-5} \times 20000\times L^2$$
$$= 20.9\times L^2$$

By covering the foregoing equation to the equation for L, $$L=(t1/20.9)^{1/2}$$

is established. Here, since t1=t2, $$L=\{(2\cdot 10^{-9})/20.9\}^{1/2}=9.78\times 10^{-6}$$

Thus, the optical channel length L is 9.78 pm.

On the other hand, from the foregoing equation (8), the channel width W is derived as follow.

$$W=(3\cdot 10^{-12})/190\cdot 10^{-5}\times 9.78\cdot 10^{-6}=161.45\times 10^{-6}$$

Thus, the optimal channel width W is 161.45 μm. Also, assuming that Wmax determined from the capacitor region is 45 μm, DIV representative of number of division of the capacitor is derived from the foregoing equation (9) as follow:

$$DIV=161.45/45=3.58$$

Therefore, number of division of the capacitor is determined to 4.

As set forth above, according to the present invention, boosting operation of the diffusion layer of the source or the drain is initiated after stabilization of the potential at the center portion of the channel at the grounding level by setting the period t1 from initiation of pre-charging of the gate of the transistor to stabilizing of the center portion of the channel which is in the floating condition, at the grounding level, and the period t2 from initiation of pre-charging of the gate of the transistor to initiation of boosting operation for the diffusion layer of the source or the drain, at equal value. Therefore, loss component as illustrated in FIGS. 8 and 9 can be avoided so that the elevating of potential in the diffusion layer as the boosting operation can be effectively performed over the entire region of the channel. Thus, the gate voltage can be elevated sufficiently.

Also, the maximum value Wmax of the channel width W is derived from the design standard of the semiconductor device or the given capacitor region. Therefore, division of the capacitor so that the capacitor may be placed within the capacitor region by dividing the channel width W which is derived through division of the desired capacitance of the capacitor by capacitance of the capacitor in the unit area and the channel length L of the capacitor, by the maximum channel width Wmax, and rounding up the fraction below decimal point of DIV as quotient of dividing calculation. Thus, number of division of the gate becomes minimum. Since number of division of the diffusion layer of the capacitor becomes one greater value than the number of division of the channel width, minimum number of division of the channel width requires minimum number of the diffusion layers. Thus, the required capacitor region becomes minimum. Furthermore, since it becomes unnecessary to set the capacitance of the capacitor at excessive value in view of low boosting efficiency, it becomes unnecessary to excessively increase the capacitor region. In addition, this can avoid necessity of design load for certainly providing the capacitor region.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the feature set out in the appended claims.

What is claimed is:

1. A method for designing capacitor of a MOS transistor, in which a drain region and a source region at both side of a gate channel region on a diffusion layer are shorted, and a capacitor having a capacitance C, a channel length L and a channel width W is formed by a portion where a gate electrode and said gate channel region overlap, with taking a capacitance of the overlapping portion of said gate electrode and said gate channel region per unit area being K1 and a resistivity of said gate channel region being K2, for application to a circuit, in which charge and discharge of said capacitor is performed at high speed, comprising a step of:

setting said channel length L and said channel width W of said MOS transistor in such a manner that a period t1 for propagating a potential from a center portion of said gate channel to said drain region or said source region, and a period t2 from rising of potential of said gate electrode from a grounding potential to a power source potential to elevating of a potential in said diffusion layer region opposing to said gate electrode from the grounding potential to the power source potential are substantially equal to each other.

2. A method for designing capacitor of a MOS transistor as set forth in claim 1, wherein, when said channel length or said channel width are set, said channel width W or said channel length L is derived from $$W = C/K1 \cdot L \text{ or } L = C/K1 \cdot W.$$

3. A method for designing capacitor of a MOS transistor as set forth in claim 1, which further comprises:

a step of deriving a maximum value Wmax of said channel width on the basis of a capacitor region; and a step of setting number DIV of division of said capacitor by rounding up a fraction below decimal point of quotient of W/Wmax.

4. A method for designing capacitor of a MOS transistor as set forth in claim 1, which further comprises:

a step of calculating said channel length L from:

$$L = \{t2/(0.55 \cdot K1 \cdot K2)\}^{1/2}$$

assuming that a resistance of said gate channel of said MOS transistor being R, by deriving a relationship expressed by $$t1 = 0.55 \, K1 \cdot K2 \cdot L^2$$

from relationship expressed by $$t1 = 0.55 CR$$

$$C = K1 \cdot LW$$

$$R = K2 \cdot L/W;$$

a step of deriving the channel width W from said channel L derived in said step of calculating said channel length, through $$W = C/K1 \cdot L;$$

a step of deriving a maximum value Wmax of said channel width W from a capacitor region; and a step of setting number DIV of division of said capacitor by rounding up a fraction below decimal point of quotient of W/Wmax.

\* \* \* \* \*